(12) United States Patent
Zhang et al.

(10) Patent No.: US 9,465,269 B2
(45) Date of Patent: Oct. 11, 2016

(54) DISPLAY ARRAY SUBSTRATE HAVING INSULATION ELEMENT BETWEEN TRANSPARENT ELECTRODES

(71) Applicant: BOE TECHNOLOGY GROUP CO., LTD., Beijing (CN)

(72) Inventors: Feng Zhang, Beijing (CN); Zhanfeng Cao, Beijing (CN); Qi Yao, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/429,830

(22) PCT Filed: Jul. 10, 2014

(86) PCT No.: PCT/CN2014/081988
§ 371 (c)(1),
(2) Date: Mar. 20, 2015

(87) PCT Pub. No.: WO2015/109776
PCT Pub. Date: Jul. 30, 2015

(65) Prior Publication Data
US 2016/0004134 A1    Jan. 7, 2016

(51) Int. Cl.
*G02F 1/1362* (2006.01)
*G02F 1/1343* (2006.01)
(Continued)

(52) U.S. Cl.
CPC ..... *G02F 1/136286* (2013.01); *G02F 1/13439* (2013.01); *G02F 1/133345* (2013.01);
(Continued)

(58) Field of Classification Search
CPC ............ G02F 1/136286; G02F 1/133345; G02F 1/133512; G02F 1/133514; G02F 1/13439; H01L 21/28; H01L 27/124; H01L 27/1259

USPC ......................................................... 257/773
See application file for complete search history.

(56) References Cited

U.S. PATENT DOCUMENTS

2007/0126969 A1*  6/2007  Kimura ............. G02F 1/134363
                                                        349/141
2008/0186439 A1*  8/2008  Kwon ............... G02F 1/136286
                                                        349/139
(Continued)

FOREIGN PATENT DOCUMENTS

CN    101126874 A    2/2008
CN    101192614 A    6/2008
(Continued)

OTHER PUBLICATIONS

Oct. 13, 2014—(WO) ISR—PCT/CN14/081988—with Eng Tran of Written Opinion.
(Continued)

*Primary Examiner* — Peter Bradford
(74) *Attorney, Agent, or Firm* — Banner & Witcoff, Ltd.

(57) ABSTRACT

An array substrate, a method for fabricating the same and a display device comprising the array substrate are disclosed. The array substrate includes: a base substrate; a plurality of gate lines (s1, s2, s3) and a plurality of data lines (d1, d2, d3) disposed on the base substrate as intersecting with each other to define a plurality of pixel regions (A, B, C, D); a first transparent electrode disposed in each of the pixel regions (A, B, C, D). The array substrate further includes: an insulation element, wherein the insulation element is disposed between two adjacent first transparent electrodes, a top surface of the insulation element is higher than a top surface of the first transparent electrode, and a bottom surface of the insulation element is lower than the top surface of the first transparent electrode. The array substrate may reduce the electric field interference between adjacent first transparent electrodes.

20 Claims, 13 Drawing Sheets

(51) Int. Cl.
*G02F 1/1333* (2006.01)
*G02F 1/1335* (2006.01)
*H01L 21/28* (2006.01)
*H01L 27/12* (2006.01)

(52) U.S. Cl.
CPC ... *G02F1/133512* (2013.01); *G02F 1/133514* (2013.01); *G02F 1/134363* (2013.01); *H01L 21/28* (2013.01); *H01L 27/124* (2013.01); *H01L 27/1259* (2013.01)

(56) References Cited

U.S. PATENT DOCUMENTS

2009/0201652 A1* 8/2009 Chew et al. ......... H05K 1/0218
361/749
2010/0067211 A1 3/2010 Han et al.
2011/0031497 A1* 2/2011 Yamazaki ........... H01L 27/1225
257/59

FOREIGN PATENT DOCUMENTS

| CN | 101539691 A | 9/2009 |
| CN | 102790012 A | 11/2012 |
| CN | 103777395 A | 5/2014 |

OTHER PUBLICATIONS

Oct. 30, 2015—(CN)—First Office Action Appn 201410039889.4 with English Tran.
Mar. 17, 2016—(CN)—Second Office Action Appn 201410039889.4 with English Tran.

* cited by examiner

DISPLAY ARRAY SUBSTRATE HAVING INSULATION ELEMENT BETWEEN TRANSPARENT ELECTRODES

The application is a U.S. National Phase Entry of International Application No. PCT/CN2014/081988 filed on Jul. 10, 2014, designating the United States of America and claiming priority to Chinese Patent Application No. 201410039889.4 filed on Jan. 27, 2014. The present application claims priority to and the benefit of the above-identified applications and the above-identified applications are incorporated by reference herein in their entirety.

FIELD OF THE ART

Embodiments of the invention relate to an array substrate, a method for fabricating the same and a display device comprising the array substrate.

BACKGROUND

An array substrate of a display device comprises a base substrate, a plurality of gate lines and a plurality of data lines disposed on the base substrate as intersecting each other to define a plurality of pixel regions, and electrodes disposed in the respective pixel regions. As illustrated in FIG. 1, two gate lines P10 and three data lines P20 intersect each other to define two pixel regions, and an electrode P30 is disposed in each of the pixel regions. With reference to an example of the electrode P30 being a pixel electrode, a cross section view along a direction AA' of the array substrate of FIG. 1 is illustrated in FIG. 2, in which two adjacent electrodes P30 are located in the same layer and with a distance d therebetween.

Currently, resolutions of array substrates have reached 300 pixels per inch (ppi), 400 ppi, 500 ppi or even higher from 200 ppi. With the increase of the resolution, the size of an individual pixel region of high resolution array substrates will be decreased. Taking a 400 ppi array substrate as an example, a width of each pixel region along a direction parallel to the gate lines is only 21 micrometers. With the decreasing of the size of the pixel regions, the distance between adjacent electrodes (i.e., d of FIGS. 1 and 2) is getting smaller and smaller, such that a regular aperture ratio of the pixel regions may be maintained. As a result, when a display device comprising such an array substrate is being driven, electric fields respectively generated by adjacent electrodes will interfere with each other, which will render disordered rotations of liquid crystals of the display device, thereby causing light leakage and color-mixing to the display device and compromising the display quality of the display device.

SUMMARY

Embodiments of the invention provide an array substrate, a method for fabricating the same, and a display device comprising the array substrate.

A first aspect of the invention provides an array substrate comprising a base substrate, a plurality of gate lines and a plurality of data line disposed on the base substrate as intersecting with each other to define a plurality of pixel regions, and a first transparent electrode disposed in each of the pixel regions. The array substrate further comprises an insulation element, wherein the insulation element is disposed between two adjacent first transparent electrodes, a top surface of the insulation element is higher than a top surface of the first transparent electrode, and a bottom surface of the insulation element is lower than the top surface of the first transparent electrode.

A second aspect of the invention provides a display device comprising the above array substrate.

A third aspect of the invention provides a method for fabricating an array substrate, comprising:
providing a base substrate which comprises a plurality of pixel regions;
forming a first transparent electrode located in each of the pixel regions of the base substrate; and
forming an insulation element between two adjacent transparent electrodes, wherein a top surface of the insulation element is higher than a top surface of the first transparent electrode, and a bottom surface of the insulation element is lower than the top surface of the first transparent electrode.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. Also, the terms such as "a," "an," etc., are not intended to limit the amount, but indicate the existence of at least one. The terms "comprises," "comprising," "includes," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 1:
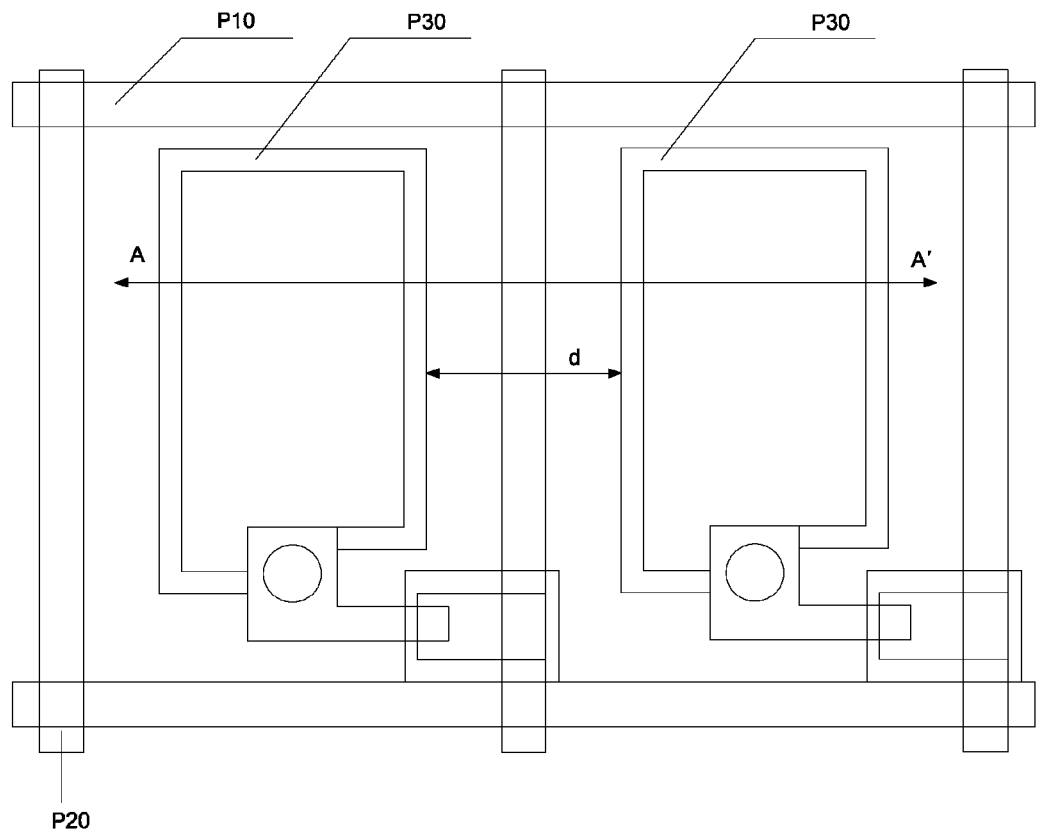
FIG. 1 is a top view of a known array substrate.
Figure 2:
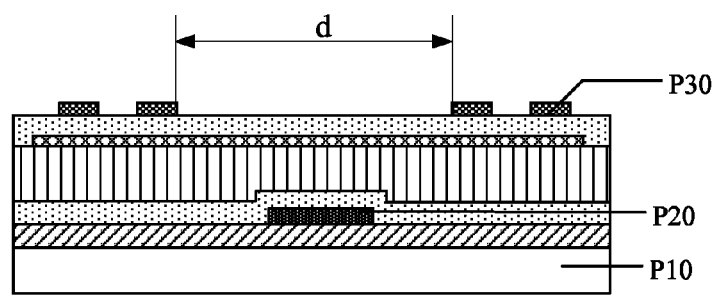
FIG. 2 is a cross section view of a known array substrate.
Figure 3:
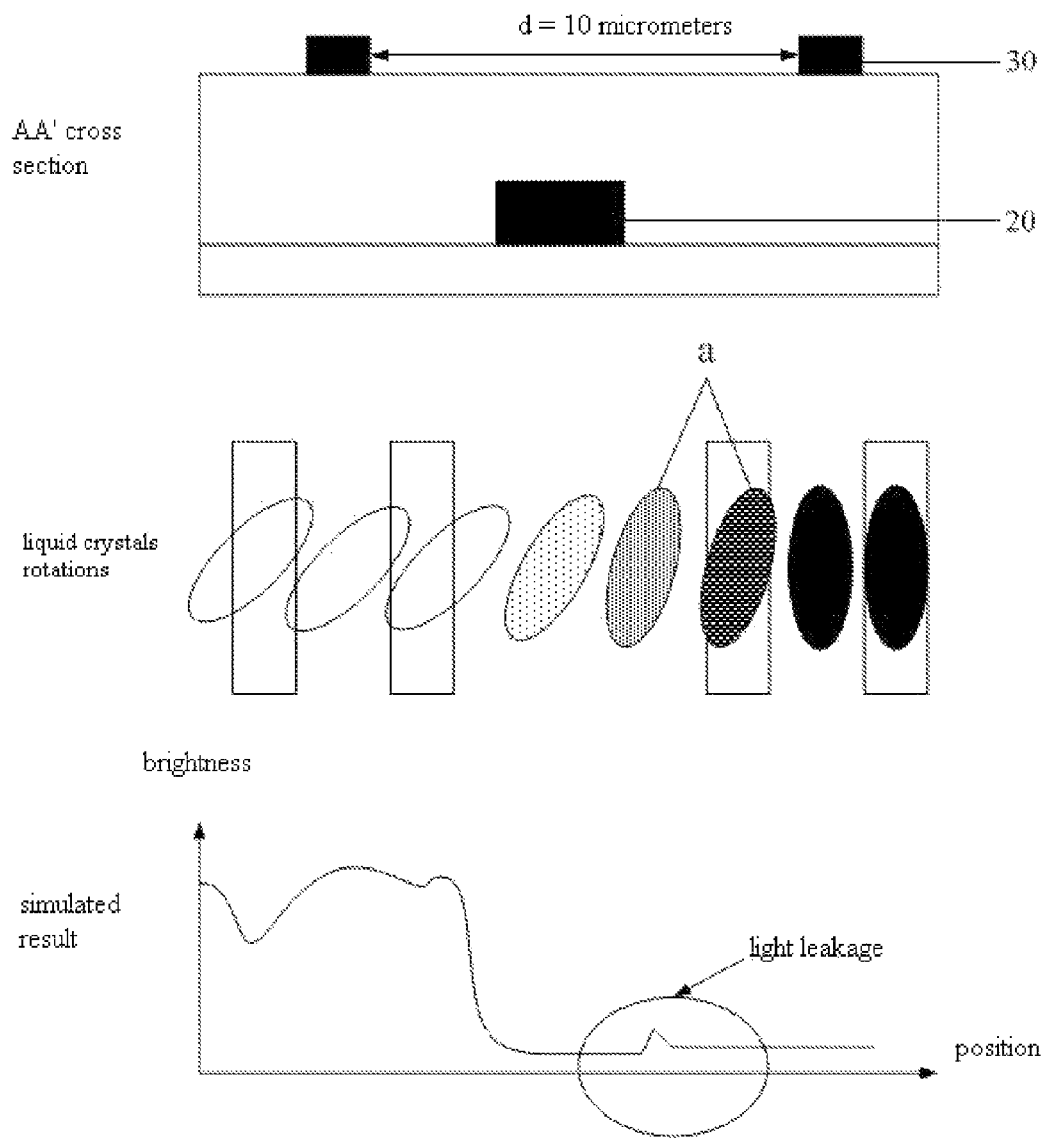
FIG. 3 schematically illustrates a test result of light leakage of a known array substrate.

FIG. 3 schematically illustrates a test result of light leakage of a known array substrate. Assuming a distance d between two pixel electrodes P30 above a data line P20 is 10 μm, light leakage of the array substrate is tested. It is seen from the test result that liquid crystal molecule a which should not rotate is rotated under an electric field generated by the two pixel electrodes P30, causing light leakage at the liquid crystal molecule a of the array substrate.

An embodiment of the invention provides an array substrate, comprising:

a base substrate;

a plurality of gate lines and a plurality of data line disposed on the base substrate as intersecting with each other to define a plurality of pixel regions; and a first transparent electrode disposed in each of the pixel regions.

The array substrate further comprises:

an insulation element, wherein the insulation element is disposed between two adjacent first transparent electrodes, a top surface of the insulation element is higher than a top surface of the first transparent electrode, and a bottom surface of the insulation element is lower than the top surface of the first transparent electrode.

Since the insulation element is disposed between two adjacent first transparent electrodes, the top surface of the insulation element is higher than the top surface of the first transparent electrodes, and the bottom surface of the insulation element is lower than the top surface of the first transparent electrodes, when a display device comprising such an array substrate is being driven, the insulation element can block electric fields generated by the first transparent electrodes to a certain extent, thereby reducing electric field interference between the adjacent first transparent electrodes, which will to some extent prevent light leakage and color mixing caused by the electric field between the adjacent first transparent electrodes, improving the display quality of the display device comprising the array substrate.

As the above configuration helps to effectively decrease the electric field interference between adjacent first transparent electrodes of the array substrate, the distance between adjacent first transparent electrodes of the array substrate in accordance with embodiments of the invention may be further reduced, such that aperture ratio and transmissivity are further increased. Moreover, areas of pixel regions of the array substrate in accordance with embodiments of the invention may be further reduced, such that array substrate with higher resolution may be developed.

In at least one embodiment of the invention, the first transparent electrode is a pixel electrode or a common electrode.

In at least one embodiment of the invention, the array substrate further comprises a second transparent electrode disposed in each of the pixel regions.

In at least one embodiment of the invention, when the first transparent electrode is a pixel electrode, the second transparent electrode is a common electrode. Alternatively, when the first transparent electrode is a common electrode, the second transparent electrode is a pixel electrode.

In the following, detailed implementations of shapes and position relationship between the first and second transparent electrodes will be described.

Embodiment 1

In the embodiment, the first transparent electrode is a slit electrode, and the second transparent electrode is a plate electrode. The second transparent electrode is disposed in a different layer from the first transparent electrode. An array substrate with such a configuration may be applied to a display device with pixel electrode and common electrode disposed in different layers.

Figure 4A:
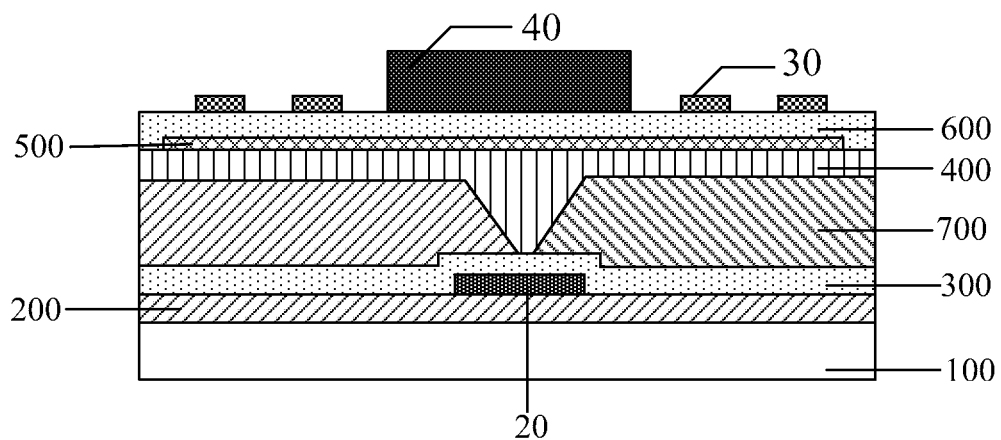
FIGS. 4A-4D schematically illustrate cross section views of an array substrate in accordance with an embodiment of the invention.
Figure 4B:
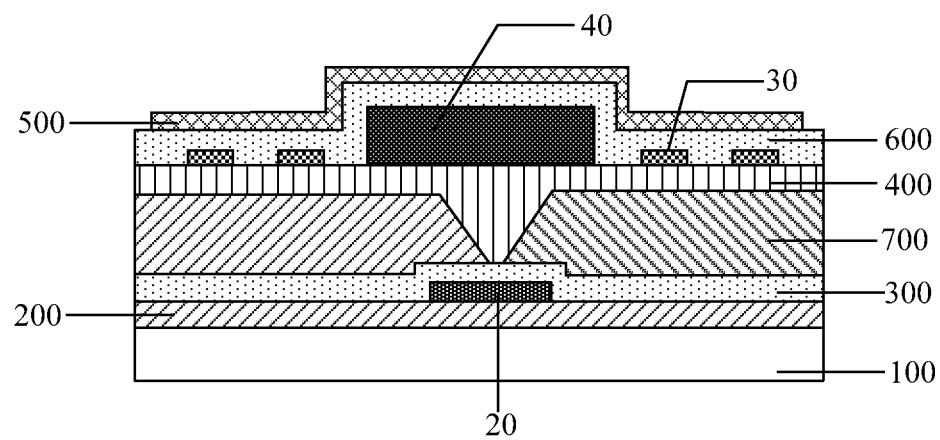
Figure 4C:
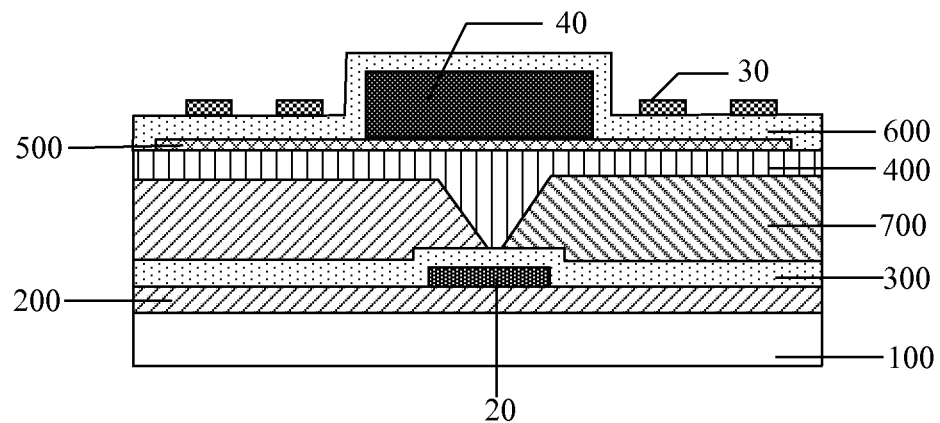

As illustrated in FIGS. 4A to 4C, the array substrate comprises:

a base substrate 100; and a gate insulation layer 200, a data line 20, a first insulation layer 300, a color filter layer 700 and a resin planarization layer 400 sequentially disposed on the base substrate 100.

The array substrate further comprises:

A first slit pixel electrode 30, a second plate pixel electrode 500, an insulation element 40 and a second insulation layer 600 disposed on the resin planarization layer 400.

The second insulation layer 600 is disposed in each of the pixel regions, and the second insulation layer 600 is disposed between the first transparent electrode 30 and the second transparent electrode 500. The insulation element 40 is disposed above or below the second insulation layer 600.

In the following, an example of the first transparent electrode being a slit pixel electrode and the second transparent electrode being a plate common electrode will be described. It can be understood that the pixel electrode and the common electrode are interchangeable.

As an example as illustrated in FIG. 4A, the first transparent electrode 30 is a slit electrode (for simplicity reasons, the plurality of slits formed in the electrode 30 are not shown) and the second transparent electrode 500 is a plate electrode. The first transparent electrode 30 and the second transparent electrode 500 are disposed in different layers, and the first transparent electrode 30 is disposed above the second transparent electrode 500. The second insulation layer 600 is disposed between the first transparent electrode 30 and the second transparent electrode 500. Moreover, the insulation element 40 is disposed above the second insulation layer 600 and in the same layer as the first transparent electrode 30.

In an example illustrated in FIG. 4B, the first transparent electrode 30 is a slit electrode and the second transparent electrode 500 is a plate electrode. The first transparent electrode 30 and the second transparent electrode 500 are disposed in different layers, and the second transparent electrode 500 is disposed above the first transparent electrode 30. The second insulation layer 600 is disposed between the first transparent electrode 30 and the second transparent electrode 500. Moreover, the insulation element 40 is disposed below the second insulation layer 600 and in the same layer as the first transparent electrode 30.

In an example illustrated in FIG. 4C, the first transparent electrode 30 is a slit electrode and the second transparent electrode 500 is a plate electrode. The first transparent electrode 30 and the second transparent electrode 500 are disposed in different layers. The second insulation layer 600 is disposed between the first transparent electrode 30 and the second transparent electrode 500. Moreover, the insulation element 40 is disposed below the second insulation layer 600 and above the second transparent electrode 500.

In each of the above array substrates, a top surface of the insulation element 40 is higher than a top surface of the first transparent electrode 30, and a bottom surface thereof is lower than the top surface of the first transparent electrode 30. When a display device comprising such an array substrate is being driven, the insulation element 40 can block an electric field generated by the first transparent electrode 30 to a certain extent, thereby reducing electric field interference between adjacent first transparent electrodes 30, which will to some extent prevent light leakage and color mixing caused by the electric field between adjacent first transparent electrodes, improving the display quality of the display device comprising the array substrate.

Embodiment 2

The first transparent electrode is a slit electrode and the second transparent electrode is a slit electrode. The second transparent electrode and the first transparent electrode are disposed in different layers. Alternatively, the second transparent electrode and the first transparent electrode are disposed in the same layer. The second transparent electrode and the first transparent electrode are alternately arranged.

When the second transparent electrode and the first transparent electrode are disposed in different layers, if an insulation element is disposed between adjacent first transparent electrodes, the insulation element may or may not be disposed between adjacent second transparent electrodes.

As an example, when the second transparent electrode and the first transparent electrode are disposed in different layers, the insulation element is disposed between two adjacent second transparent electrodes; a top surface of the insulation element is higher than a top surface of the second transparent electrodes, and a bottom surface of the insulation element is lower than the top surface of the second transparent electrodes.

By disposing the insulation element between two adjacent second transparent electrodes as well, electric field interference between adjacent second transparent electrodes may be further reduced, which will to a certain extent prevent light leakage and color mixing caused by the electric field interference, improving the display quality of the display device comprising the array substrate.

As an example, the second transparent electrode and the first transparent electrode are disposed in different layers, and the second transparent electrode and the first transparent electrode are alternately arranged. An array substrate having such a configuration may be applied to a display device where slit pixel electrodes and slit common electrodes need to be alternately arranged in different layers.

As an example, when the second transparent electrode and the first transparent electrode are disposed in the same layer and the second transparent electrode and the first transparent electrode are alternately arranged, the insulation element is disposed between the first transparent electrode and the second transparent electrode respectively located in two adjacent pixel regions; a top surface of the insulation element is above top surfaces of the first transparent electrode and the second transparent electrode, and a bottom surface of the insulation element is lower than the top surfaces of the first transparent electrode and the second transparent electrode. An array substrate having such a configuration may be applied to a display device where slit pixel electrodes and slit common electrodes need to be alternately arranged in the same layer. Therefore, the insulation element has to be disposed between a pixel electrode and a common electrode respectively located in two adjacent pixel regions and next to each other.

"Being alternately arranged" as described herein refers to a first slit transparent electrode comprises a plurality of first slit electrodes, a second slit transparent electrode comprises a plurality of second slit electrodes. In a pixel region, the plurality of first slit electrodes and the plurality of second slit electrodes are alternately arranged.

In at least one embodiment of the invention, a material of the insulation element is an insulating material.

As an example, a material of the insulation element is an opaque material, such as chrome or compounds thereof. Alternatively, the material is a material for forming a black matrix, such as a black resin. As another example, a material of the insulation element is a transparent material, such as a photoresist material or polymethyl methacrylate (PMMA) and the like.

In at least one embodiment of the invention, the position relationship of the insulation element has to meet the following requirement: the insulation element is disposed between two adjacent first transparent electrodes; a top surface of the insulation element is higher than a top surface of the first transparent electrodes, and a bottom surface of the insulation element is lower than the top surface of the first transparent electrodes.

In the following, the position relationship of the insulation element of the embodiment of the invention will be described with reference to an example of a first transparent electrode being a pixel electrode. It is noted that the position relationship of the insulation element when the first transparent electrode is a common electrode according to embodiments of the invention is the similar to that of the position relationship of the embodiment of the invention and will not be elaborated here.

In the following, various implementations of the insulation element being disposed between two adjacent pixel electrodes according to the embodiment of the invention will be described by category, with reference to the position relationship between the insulation element, the gate lines and the data lines.

A. The Insulation Elements being Disposed Outside the Pixel Regions

In at least one embodiment, a first and second insulation elements are respectively disposed at positions corresponding to a gate line and a data line. As the first and second insulation elements are disposed according to positions of the gate line and the data line, it is relatively easy in terms of processes to fabricate the insulation elements at the positions corresponding to the gate line and data line, in comparison with the process difficulty of fabricating the first and second insulation elements at other positions.

In at least one embodiment, when the first and second insulation elements are disposed as intersecting with each other, at least one insulation element is present at the intersection point.

In at least one embodiment, the first and second insulation elements are made of an opaque material and the first and second insulation elements function as black matrix.

When the first and second insulation elements are respectively located at the positions corresponding to the gate line and the data line and the first and second insulation elements are made of an opaque material, the first and second insulation elements may directly function as black matrix for blocking ambient light. Therefore, no extra process steps are required to form the black matrix, which could save process step and cost.

Moreover, while the electric field interference between adjacent pixel electrodes on the array substrate is reduced, the black matrix originally located on the color filter substrate may be fabricated on the array substrate, so as to enhance the functionality of the array substrate and reduce the complexity of the color filter substrate.

In exemplary implementations, any of embodiments of the first and second insulation elements being respectively located in positions corresponding to the gate line and the data line are applicable to the embodiment. In the following, several typical scenarios will be described. It is noted that the following typical scenarios are illustrative instead of limitative to the embodiment of the invention.

1. the First and Second Insulation Elements Respectively Overlapping the Gate Line and the Data Line.

In at least one embodiment, when a first insulation element completely overlapping a gate line and a second insulation element completely overlapping a data line intersect with each other, at least one layer of insulation element is present at an intersection point between the first insulation element and the second insulation element. That is, the first and/or second insulation element is present at the intersection point between the first insulation element and the second insulation element. Herein 'completely overlapping' refers to the situation of both objects having identical shapes and areas. That is, both the gate line and the first insulation element are strip or line-shaped and have the same area; both the data line and the second insulation element are strip or line-shaped and have the same area.

Figure 5A:
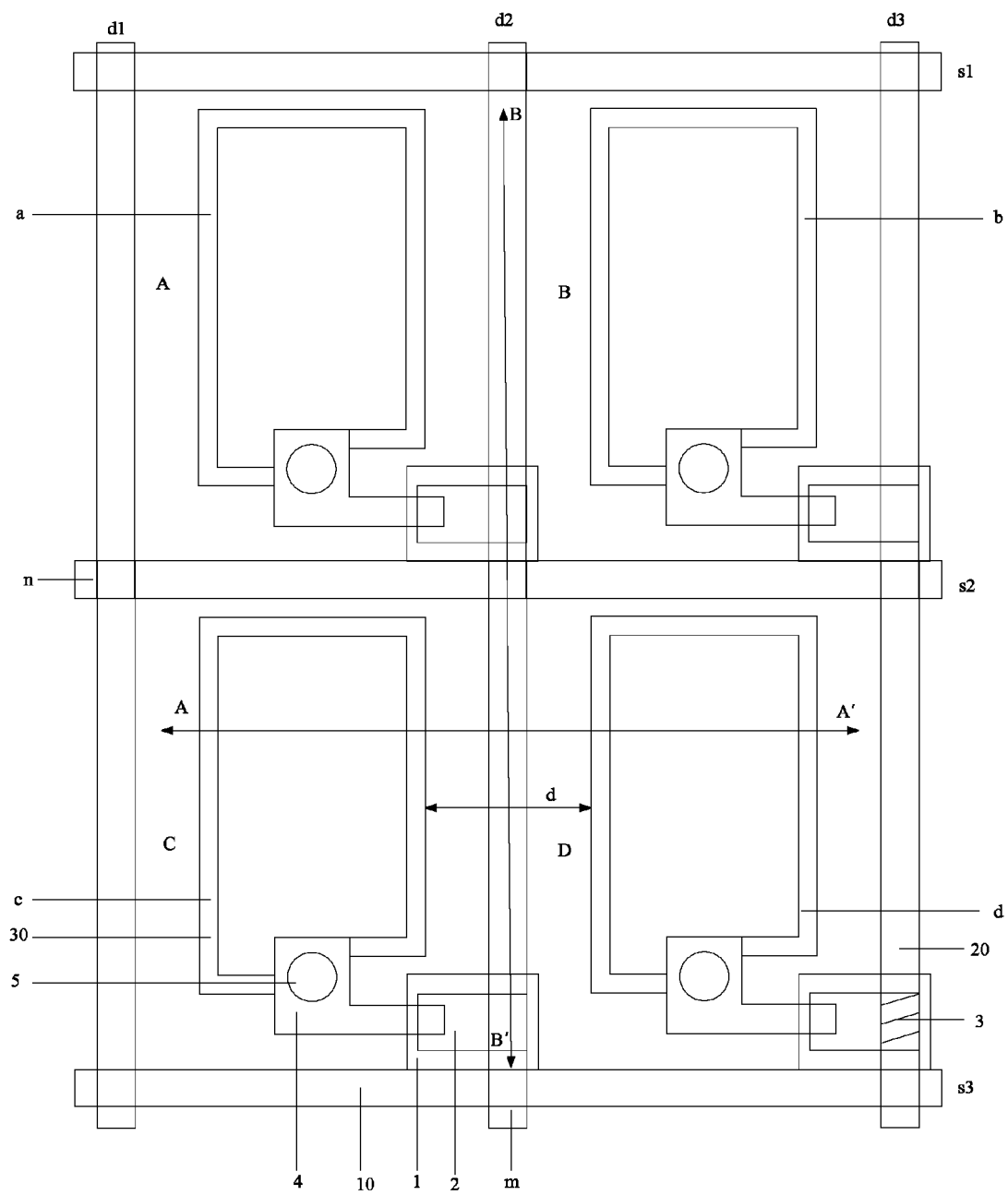
FIGS. 5A-5I schematically illustrate top views of an array substrate in accordance with an embodiment of the invention.

In an example illustrated in FIG. 5A, s1, s2 and s3 are gate lines and d1, d2 and d3 are data lines. s1, s2 and s3 and d1, d2 and d3 intersect with each other to define pixel regions A, B, C and D; a pixel electrode a is located in the pixel region A, a pixel electrode b is located in the pixel region B, a pixel electrode c is located in the pixel region C, and a pixel electrode d is located in the pixel region D.

Herein, for the purpose of reducing electric field interference between the adjacent pixel electrodes a and b and electric field interference between the adjacent pixel electrodes c and d, a first insulation element m is disposed between the pixel electrodes a and b (that is, between the pixel electrodes c and d) and in the same layer as the pixel electrodes a, b, c, and d. Moreover, the first insulation element m overlaps the data line d2 completely (that is, m and d2 are identical to each other in both shapes and areas).

For the purpose of reducing electric field interference between the adjacent pixel electrodes a and c and electric field interference between the adjacent pixel electrodes b and d, a second insulation element n is disposed between the pixel electrodes a and c (that is, between the pixel electrodes b and d) and in the same layer as the pixel electrodes a, b, c, and d. Moreover, the second insulation element n overlaps the gate line s2 completely (that is, n and s2 are identical to each other in both shapes and areas).

The first insulation element m and/or the second insulation element n are present at the intersection point between the first insulation element m and the second insulation element n.

In practice, if both of the above insulation elements function as black matrix directly, good shielding effect and protection can be guaranteed. Moreover, the insulation elements may be fabricated by using masks for fabricating the gate lines and data lines and similar process procedures, which may reduce the complexity and cost for fabricating the insulation elements.

2. an Area of the First Insulation Element is Larger than that of the Gate Line, and an Area of the Second Insulation Element is Larger than that of the Data Line.

Figure 5B:
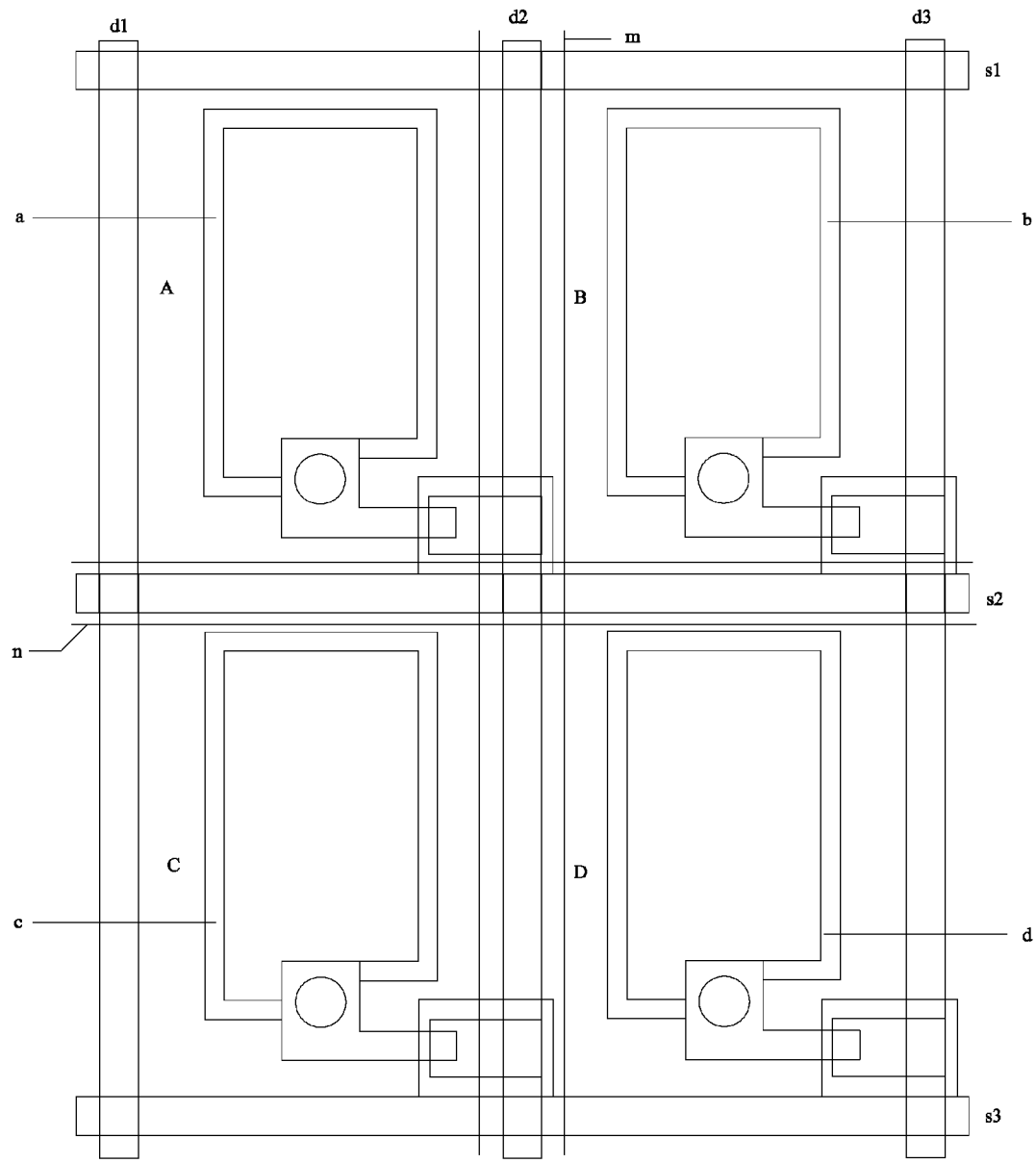

In an example as illustrated in FIG. 5B, s1, s2 and s3 are gate lines and d1, d2 and d3 are data lines. s1, s2 and s3 and d1, d2 and d3 intersect with each other to define pixel regions A, B, C and D; a pixel electrode a is located in the pixel region A, a pixel electrode b is located in the pixel region B, a pixel electrode c is located in the pixel region C, and a pixel electrode d is located in the pixel region D.

Herein, for the purpose of reducing electric field interference between the adjacent pixel electrodes a and b and electric field interference between the adjacent pixel electrodes c and d, a first insulation element m is disposed between the pixel electrodes a and b (that is, between the pixel electrodes c and d) and in the same layer as the pixel electrodes a, b, c, and d. Moreover, an area of the first insulation element m is larger than that of the data line d2.

For the purpose of reducing electric field interference between the adjacent pixel electrodes a and c and electric field interference between the adjacent pixel electrodes b and d, a second insulation element n is disposed between the pixel electrodes a and c (that is, between the pixel electrodes b and d) and in the same layer as the pixel electrodes a, b, c, and d. Moreover, an area of the second insulation element n is larger than that of the gate line s2.

In practice, if both of the above insulation elements function as black matrix directly, good shielding effect and protection can be guaranteed.

3. an Area of the First Insulation Element is Smaller than that of the Gate Line, and an Area of the Second Insulation Element is Smaller than that of the Data Line.

Figure 5C:
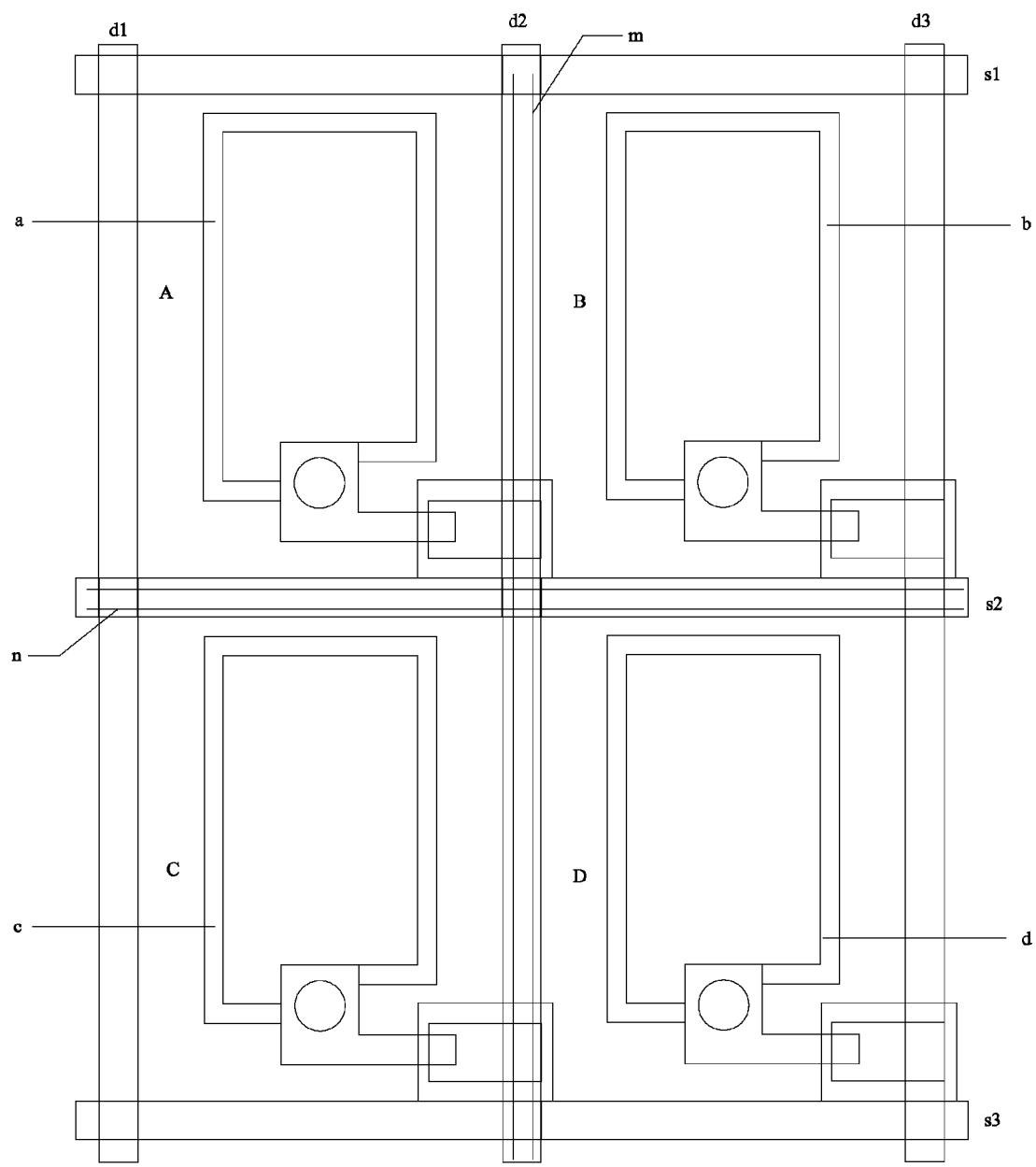

In an example as illustrated in FIG. 5C, s1, s2 and s3 are gate lines and d1, d2 and d3 are data lines. s1, s2 and s3 and d1, d2 and d3 intersect with each other to define pixel regions A, B, C and D; a pixel electrode a is located in the pixel region A, a pixel electrode b is located in the pixel region B, a pixel electrode c is located in the pixel region C, and a pixel electrode d is located in the pixel region D.

Herein, for the purpose of reducing electric field interference between the adjacent pixel electrodes a and b and electric field interference between the adjacent pixel electrodes c and d, a first insulation element m is disposed between the pixel electrodes a and b (that is, between the pixel electrodes c and d) and in the same layer as the pixel electrodes a, b, c, and d. Moreover, an area of the first insulation element m is smaller than that of the data line d2.

For the purpose of reducing electric field interference between the adjacent pixel electrodes a and c and electric field interference between the adjacent pixel electrodes b and d, a second insulation element n is disposed between the pixel electrodes a and c (that is, between the pixel electrodes b and d) and in the same layer as the pixel electrodes a, b, c, and d. Moreover, an area of the second insulation element n is smaller than that of the gate line s2.

In practice, if both of the above insulation elements function as black matrix directly, good shielding effect and protection can be guaranteed.

4. the Insulation Element Overlaps the Gate Line and the Data Line Partially.

Figure 5D:
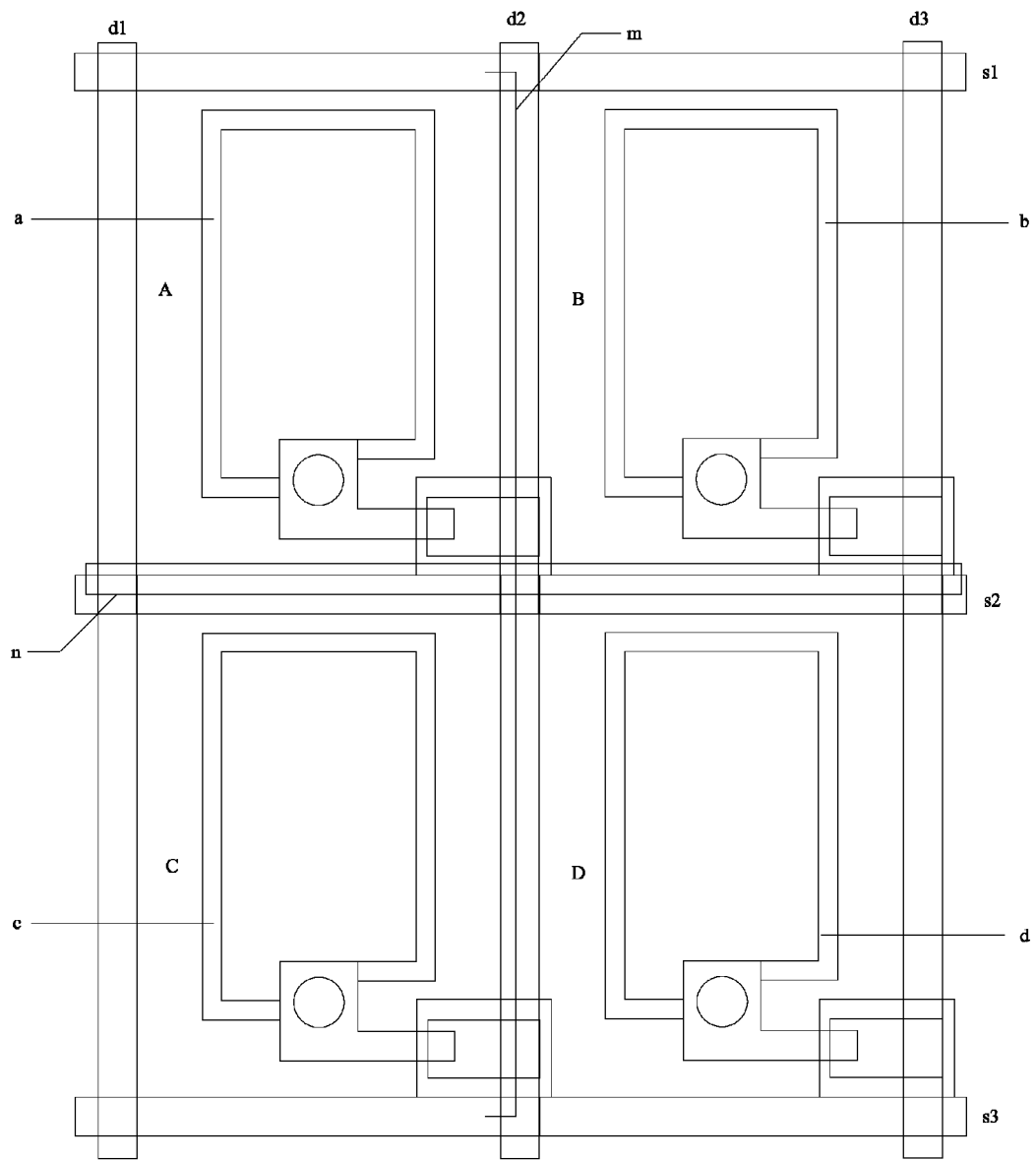

In an example as illustrated in FIG. 5D, s1, s2 and s3 are gate lines and d1, d2 and d3 are data lines. s1, s2 and s3 and d1, d2 and d3 intersect with each other to define pixel regions A, B, C and D; a pixel electrode a is located in the pixel region A, a pixel electrode b is located in the pixel region B, a pixel electrode c is located in the pixel region C, and a pixel electrode d is located in the pixel region D.

Herein, for the purpose of reducing electric field interference between the adjacent pixel electrodes a and b and electric field interference between the adjacent pixel electrodes c and d, a first insulation element m is disposed between the pixel electrodes a and b (that is, between the pixel electrodes c and d) and in the same layer as the pixel electrodes a, b, c, and d. Moreover, the first insulation element m partially overlaps the data line d2 as well as the pixel regions A and C.

For the purpose of reducing electric field interference between the adjacent pixel electrodes a and c and electric field interference between the adjacent pixel electrodes b and d, a second insulation element n is disposed between the pixel electrodes a and c (that is, between the pixel electrodes b and d) and in the same layer as the pixel electrodes a, b, c, and d. Moreover, the second insulation element n overlaps the gate line s2 as well as the pixel regions A and B partially.

It is noted that the first insulation element m may overlap the pixel regions B and D partially while overlapping the data line d2 partially. Moreover, the second insulation element n may overlap the pixel regions C and D partially while overlapping the gate line s2 partially.

In practice, as the above first and second insulation elements are disposed according to the positions of the gate line and the data line, the process difficulty of the insulation elements may be reduced.

5. the First and Second Insulation Elements are Disposed at Positions Corresponding to the Gate Line and the Data Line in Segments.

Figure 5E:
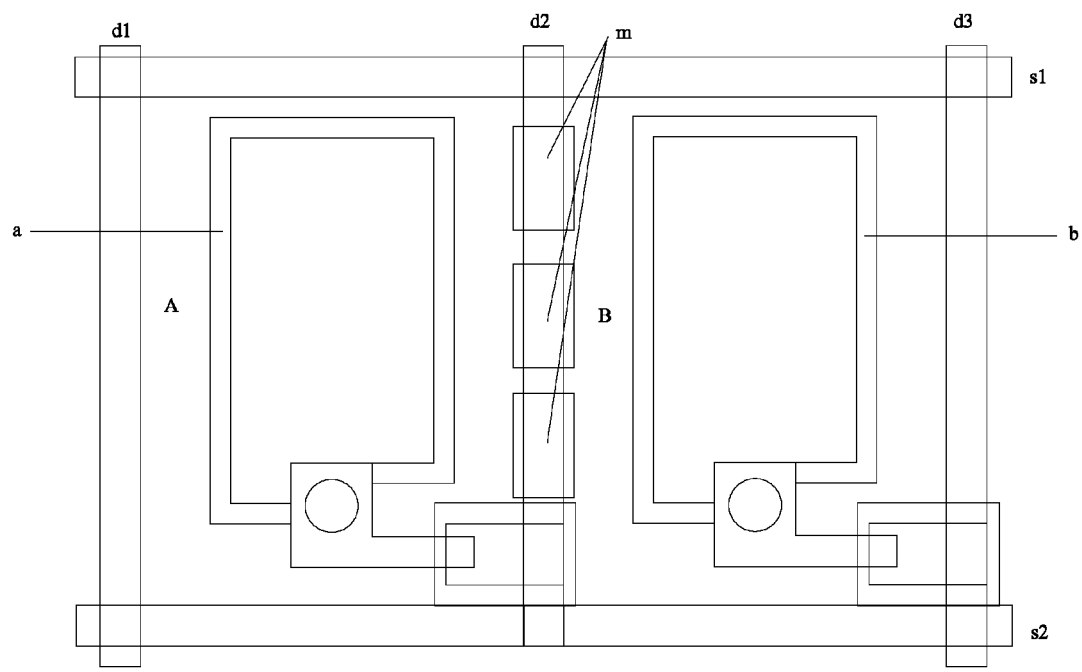

In an example as illustrated in FIG. 5E, s1 and s2 are gate lines and d1, d2 and d3 are data lines. s1 and s2 and d1, d2 and d3 intersect with each other to define pixel regions A and B; a pixel electrode a is located in the pixel region A, and a pixel electrode b is located in the pixel region B.

Herein, for the purpose of reducing electric field interference between the adjacent pixel electrodes a and b, a first insulation element m is disposed in the same layer as the pixel electrodes a and b and at a position corresponding to the data line d2.

As an example, the first insulation element m comprises three sub-segments, and the three sub-segments of the insulation elements m are disposed evenly (that is, with equal intervals) at a position corresponding to the data line d2.

It is noted that FIG. 5E is an introduction of the embodiment where the first insulation element being disposed at positions corresponding to the data line in segments. An embodiment of the second insulation element being disposed at positions corresponding to the gate line in segments will not be elaborated herein as it is similar to that of the first insulation element being disposed at positions corresponding to the data line in segments. It can be understood that various positions of the insulation element as illustrated in FIGS. 5A to 5D are also applicable to insulation elements having a plurality of sub-segments.

In practice, the cost of fabricating the insulation elements may be reduced and the flexibility of fabricating the insulation elements may be increased when the first and second insulation elements are respectively disposed at positions corresponding to the gate line and the data line in segments.

B. The Insulation Elements being Disposed in the Pixel Regions

Any of embodiments of the insulation elements being respectively located in the pixel regions are applicable to the embodiment of the invention. In the following, several typical scenarios will be described. It is noted that the following typical scenarios are illustrative instead of limitative to the embodiment of the invention.

1. being Disposed Around the Pixel Electrodes.

Figure 5F:
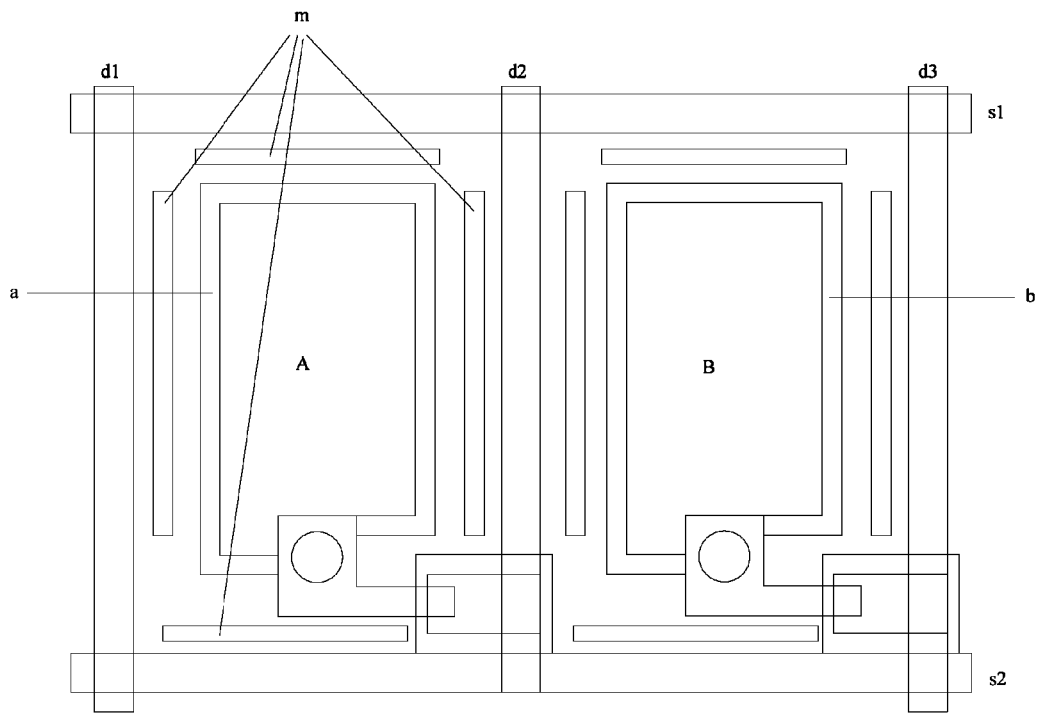

In an example as illustrated in FIG. 5F, s1 and s2 are gate lines, d1, d2 and d3 are data liens; s1 and s2 intersect with d1, d2 and d3 to define pixel regions A and B; a pixel electrode a is located in the pixel region A and a pixel electrode b is located in the pixel region B.

For the purpose of reducing electric field interference between the adjacent pixel electrodes a and b, an insulation element m is disposed in the same layer as the pixel electrodes a and b respectively in the pixel regions A and B and around the pixel electrodes a and b (that is, on four sides of each of the pixel electrodes), thereby realizing disposing two insulation elements between two adjacent pixel electrodes a and b.

2. Insulation Elements being Disposed on Two Sides of the Pixel Electrodes and Insulation Elements on the Two Sides of the Pixel Electrodes being Vertical to Each Other.

Figure 5G:
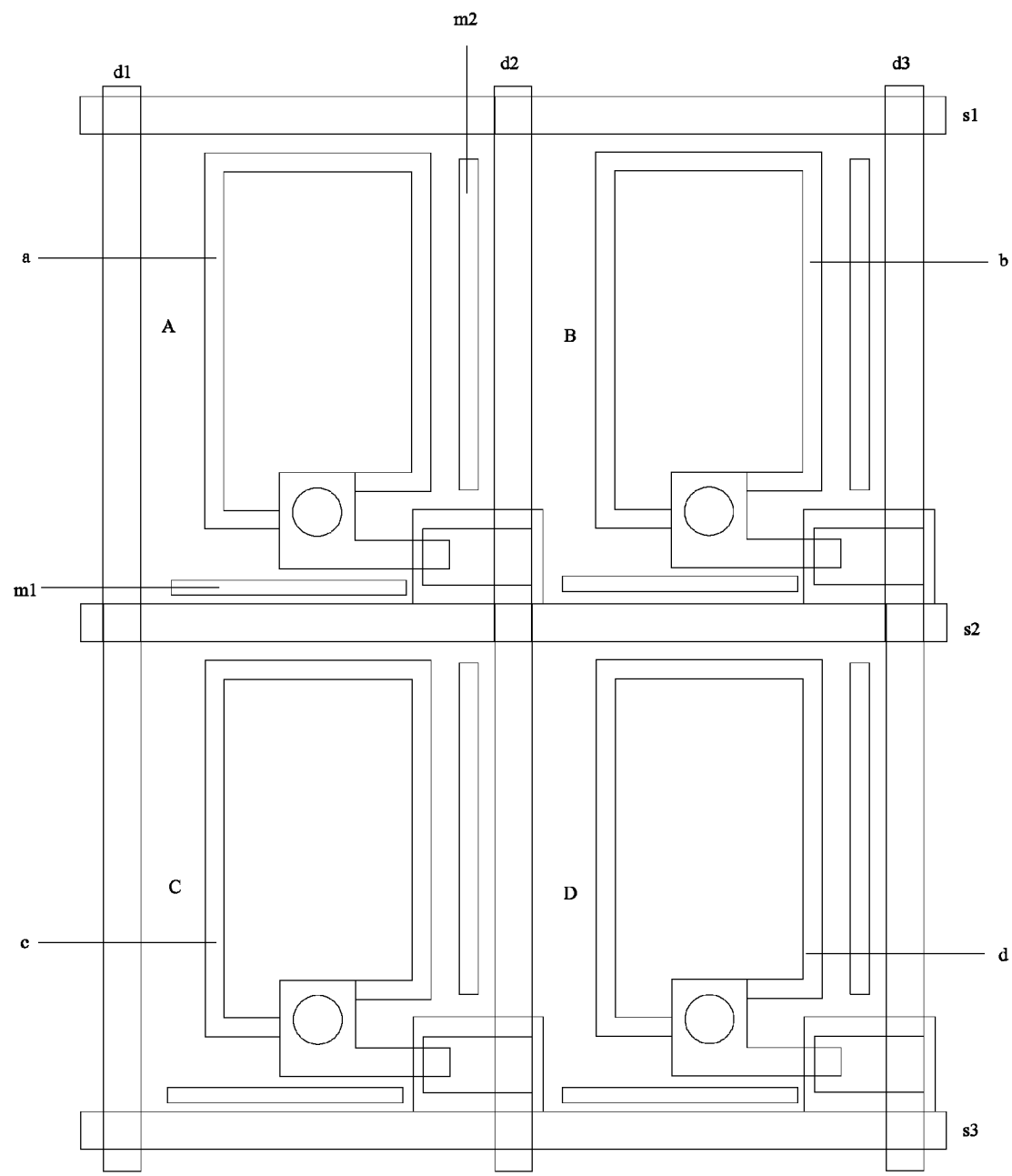

In an example as illustrated in FIG. 5G, s1, s2 and s3 are gate lines and d1, d2 and d3 are data lines. s1, s2 and s3 and d1, d2 and d3 intersect with each other to define pixel regions A, B, C and D; a pixel electrode a is located in the pixel region A, a pixel electrode b is located in the pixel region B, a pixel electrode c is located in the pixel region C, and a pixel electrode d is located in the pixel region D.

For the purpose of reducing electric field interference between the adjacent pixel electrodes a and b and electric field interference between the adjacent pixel electrodes a and c, an insulation element m being disposed in the pixel region A comprises a first part m1 and a second part m2, m1 is vertical to m2, wherein m1 is disposed between the pixel electrodes a and c, m2 is disposed between the pixel electrodes a and b. That is, m1 and m2 are disposed on two adjacent sides of the pixel electrode a.

Insulation elements in pixel regions B, C and D are similar to the insulation element in the pixel region A and will not be elaborated here.

3. being Disposed on Three Sides of the Pixel Electrode.

Figure 5H:
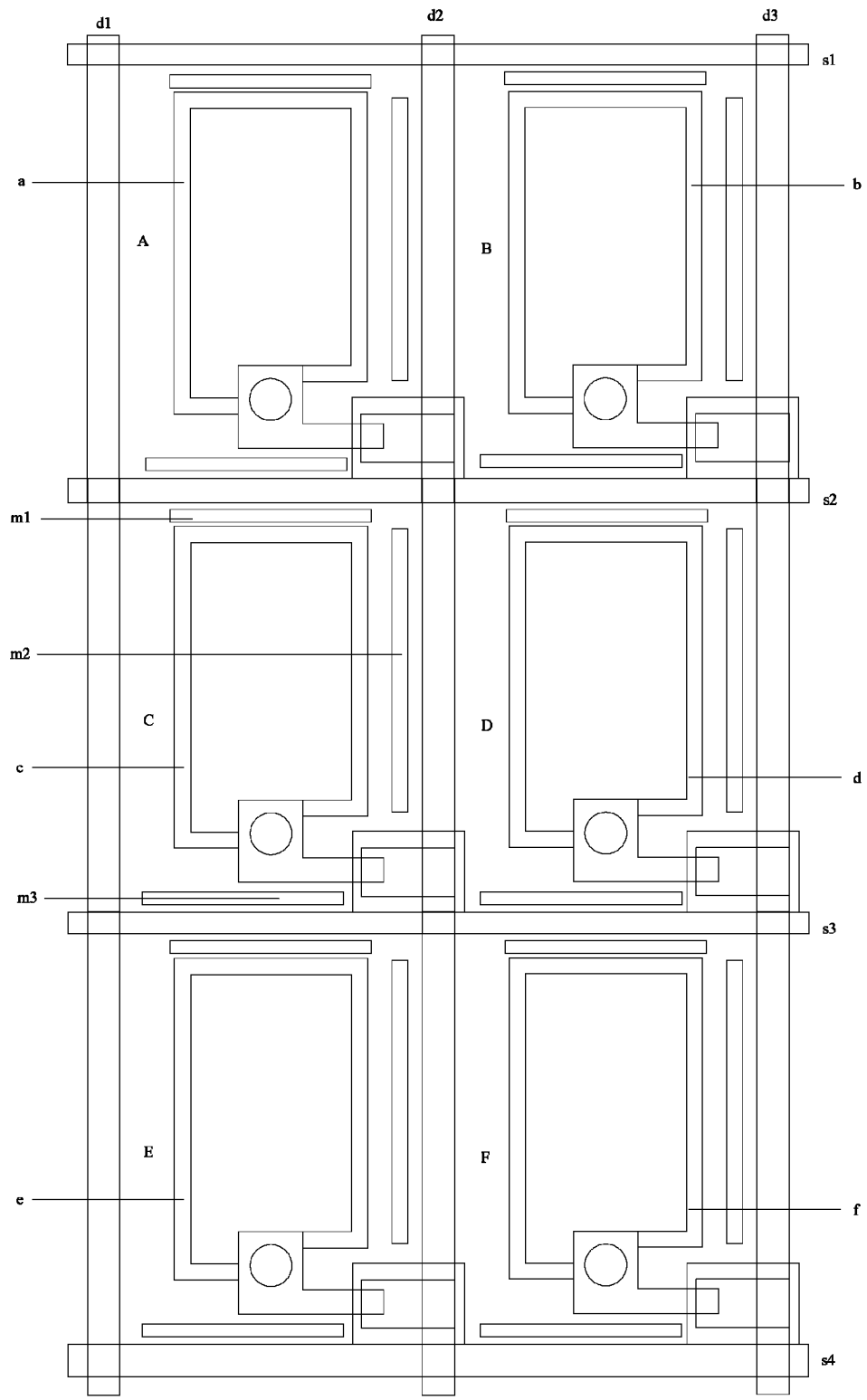

In an example as illustrated in FIG. 5H, s1, s2, s3 and s4 are gate lines and d1, d2 and d3 are data lines. s1, s2, s3 and s4 and d1, d2 and d3 intersect with each other to define pixel regions A, B, C, D, E and F; a pixel electrode a is located in the pixel region A, a pixel electrode b is located in the pixel region B, a pixel electrode c is located in the pixel region C, a pixel electrode d is located in the pixel region D, a pixel electrode e is located in the pixel region E, and a pixel electrode f is located in the pixel region F.

By taking an insulation element in the pixel region C as an example, the insulation element m comprises a first part m1, a second part m2 and a third part m3, the first part m1 is disposed between the pixel electrodes c and a, the second part m2 is disposed between the pixel electrode c and d, and the third part m3 is disposed between the pixel electrodes c and e. The first part m1 can reduce electric field interference between the adjacent pixel electrodes c and a, the second part m2 can reduce electric field interference between the adjacent pixel electrodes c and d, and the third part m3 can reduce electric field interference between the adjacent pixel electrodes c and e.

Insulation elements in pixel regions A, B, D, E and F are similar to the insulation element in the pixel region C and will not be elaborated here.

In the following, the implementation of the top surface of the insulation element being higher than the top surface of the first transparent electrode and the bottom surface of the insulation element being lower than the top surface of the first transparent electrode according to the embodiment of the invention will be described by category, with reference to the position relationship between the bottom surface of the insulation element and that of the first transparent electrode. It is noted that the following scenarios are illustrative instead of limitative to the embodiment of the invention.

A. The Bottom Surface of the Insulation Element being Flush with the Bottom Surface of the First Transparent Electrode.

In an example as illustrated in FIG. 4A, the insulation element 40 is disposed between the first transparent electrodes 30, the top surface of the insulation element 40 is higher than that of the first transparent electrodes 30, the bottom surface of the insulation elements 40 is lower than the top surface of the first transparent electrodes 30, and the bottom surface of the insulation elements 40 is flush with that of the first transparent electrodes 30.

In at least one embodiment, the insulation element and the first transparent electrodes are disposed on any one of the film layers having electrically insulation property.

In the example as illustrated in FIG. 4A, the first insulation element 40 and the first transparent electrodes 30 are disposed on the second insulation layer 600. Alternatively, in the example as illustrated in FIG. 4B, the first insulation element 40 and the first transparent electrodes 30 are disposed on the resin planarization layer 400.

B. The Bottom Surface of the Insulation Element being Lower than that of the First Transparent Electrodes.

In an example as illustrated in FIG. 4C, the insulation element 40 is disposed between the first transparent electrodes 30, the top surface of the insulation element 40 is higher than that of the first transparent electrodes 30, the bottom surface of the insulation elements 40 is lower than the top surface of the first transparent electrodes 30, and the bottom surface of the insulation elements 40 is also lower than that of the first transparent electrodes 30.

C. The Bottom Surface of Insulation Element being Higher than that of the First Transparent Electrodes.

Figure 4D:
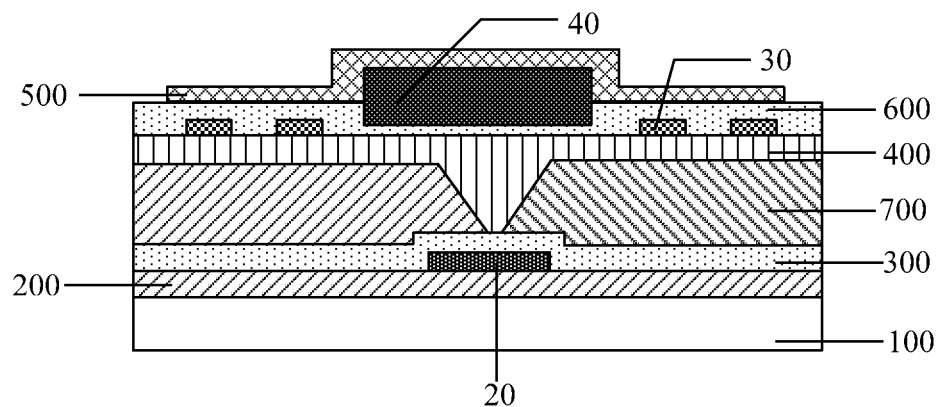

In an example as illustrated in FIG. 4D, the insulation element 40 is disposed between the first transparent electrodes 30, the top surface of the insulation element 40 is higher than that of the first transparent electrodes 30, the bottom surface of the insulation elements 40 is lower than the top surface of the first transparent electrodes 30, and the bottom surface of the insulation elements 40 is higher than the bottom surface of the first transparent electrodes 30.

In the following, shapes of the insulation element according to the embodiments of the invention will be described with reference to an example of the first transparent electrode being a pixel electrode. It is note that implementations of shapes of the insulation element according to the embodiments of the invention when the first transparent electrodes are common electrodes are similar to implementations of the shapes of the insulation element according to the embodiments of the invention and will not be elaborated herein.

In at least one embodiment of the invention, the shapes of the insulation element according to the embodiment of the invention are arbitrary, such as a regular or irregular shape.

Figure 5I:
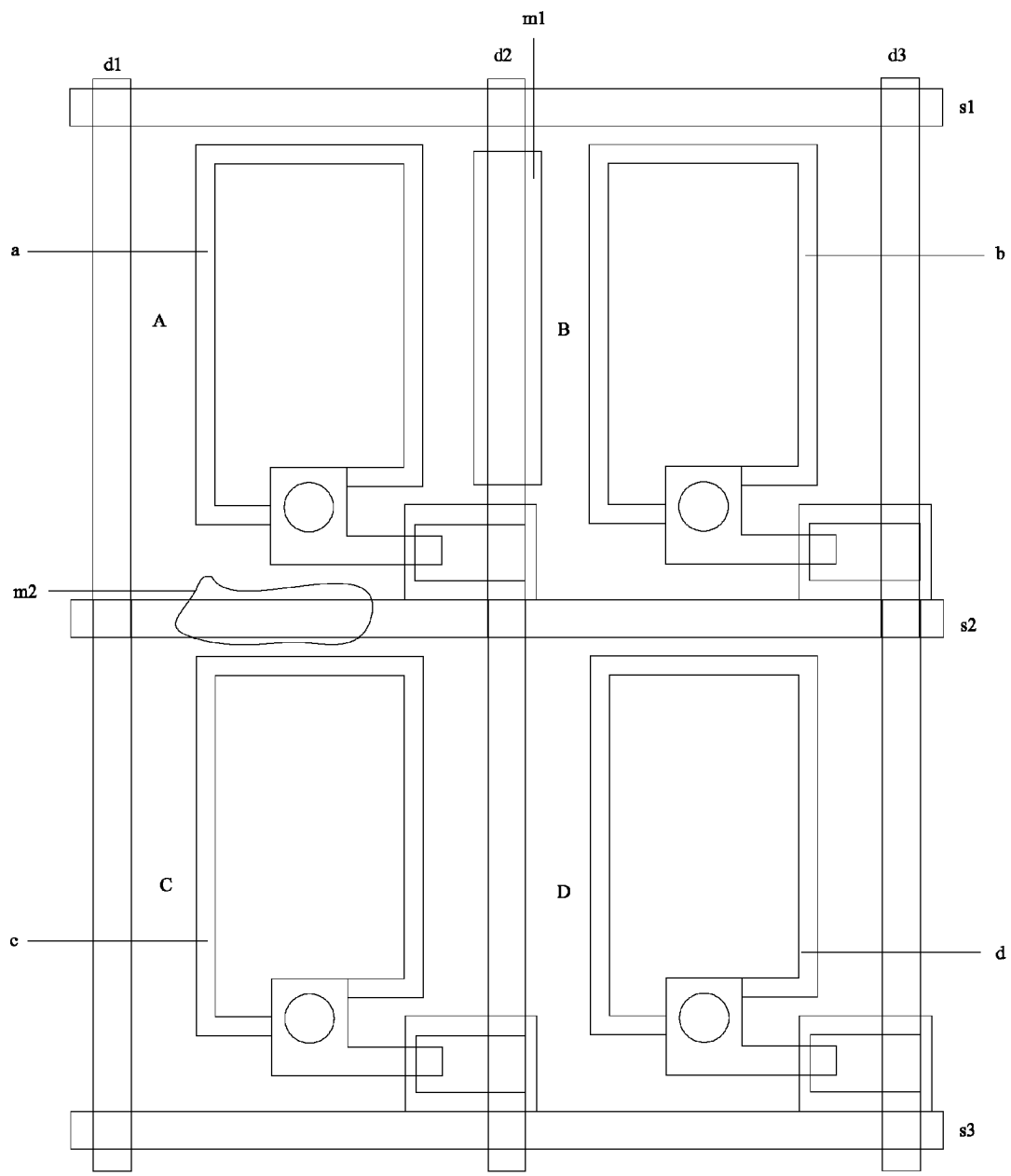

In an example as illustrated in FIG. 5I, s1, s2 and s3 are gate lines and d1, d2 and d3 are data lines. s1, s2 and s3 and d1, d2 and d3 intersect with each other to define pixel regions A, B, C and D; a pixel electrode a is located in the pixel region A, a pixel electrode b is located in the pixel region B, a pixel electrode c is located in the pixel region C, and a pixel electrode d is located in the pixel region D.

A shape of the insulation element m1 between the pixel electrodes a and b is a regular rectangular, while the insulation element m2 between the pixel electrodes a and c is of an irregular shape.

In at least one embodiment, the insulation element is a strip, and a cross section of the insulation element is a rectangular or a trapezoid.

Figure 6:
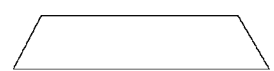
FIG. 6 is a cross section view of an insulation element in accordance with an embodiment of the invention.

In an example as illustrated in FIG. 5A, the insulation element m is a strip arranged along the data line d2. As illustrated in FIG. 6, the cross section of the insulation element m (that is the cross section along the direction AA' of the array substrate as illustrated in FIG. 5A) is a trapezoid with a shorter upper base and a longer lower base. In comparison to the insulation element with a rectangular cross section, an insulation element with a trapezoid cross section is not so easily broken.

In practice, it is relatively easy in terms of fabrication difficulty to fabricate the insulation element as a strip than to fabricate it in other shapes.

In at least one embodiment, a distance between the top surface of the insulation element and that of the first transparent electrode is larger than or equal to 1 μm. Therefore, a thickness of the insulation element is larger than or equal to 1 μm.

It is noted that specific thickness of the insulation element according to the embodiment of the invention is illustrative instead of limitative to the invention. Other implementations that may realize the objectives of the invention are also within the scope of the invention.

In practice, the electric field interference between the first transparent electrodes may be decreased when the distance between the top surface of the insulation element and that of the first transparent electrode is larger than or equal to 1 μm.

The array substrate of the embodiment of the invention further comprises a color filter layer, wherein the color filter layer is disposed below the film layer having the insulation element.

In practice, the color filter layer originally disposed on the color filter substrate is fabricated on the array substrate, which facilitates the self-alignment between the pixels, thereby simplifying the fabrication process, increasing the aperture ratio and the transmissivity, improving the product quality and reducing the cost. Moreover, the functionality of the array substrate is enhanced and the complexity of the color filter substrate is reduced.

Another embodiment of the invention further provides a display device comprising any of the array substrate.

The display device may be a mobile phone, a tablet PC, a television, a display panel, a notebook, a digital photoframe, a navigator and a product or component having a display function.

In practice, the insulation element of the arrays substrate comprised in the display device can block the electric field generated by the first transparent electrodes to a certain extent, thereby reducing electric field interference between adjacent first transparent electrodes of the array substrate comprising in the display device, which will to some extent prevent light leakage and color mixing caused by the electric field between the adjacent first transparent electrodes, improving the display quality of the display device comprising the array substrate.

Still another embodiment of the invention provides a method for fabricating an array substrate, comprising:

providing a base substrate comprising a plurality of pixel regions;

forming a first transparent electrode located in each of the pixel regions of the base substrate; and forming an insulation element between two adjacent first transparent electrodes, wherein a top surface of the insulation element is higher than a top surface of the first transparent electrodes, and a bottom surface of the insulation element is lower than the top surface of the first transparent electrodes.

In the method, the pixel regions are defined by a plurality of gate lines and a plurality of data lines intersecting with each other.

In practice, when driving a display device comprising the above array substrate, the insulation element can block an electric field generated by the first transparent electrodes to a certain extent, thereby reducing electric field interference between adjacent first transparent electrodes, which will to some extent prevent light leakage and color mixing caused by the electric field between the adjacent first transparent electrodes, improving the display quality of the display device comprising the array substrate.

In at least one embodiment of the invention, a material of the insulation element is opaque, and the insulation element functions as a black matrix.

In practice, when the electric field interference between adjacent pixel electrodes on the array substrate is reduced, the black matrix originally located on the color filter substrate is also fabricated on the array substrate, so as to enhance the functionality of the array substrate and reduce the complexity of the color filter substrate.

In at least one embodiment of the invention, the method further comprises the following step before forming the first transparent electrode:

forming a color filter layer below an insulation element to be formed.

In practice, the color filter layer originally disposed on the color filter substrate is fabricated on the array substrate, which facilitates the self-alignment between the pixels, thereby simplifying the fabrication process, increasing the aperture ratio and the transmissivity, improving the product quality and reducing the cost. Moreover, the functionality of the array substrate is enhanced and the complexity of the color filter substrate is reduced.

To illustrate the method for fabricating the array substrate according to the embodiment of the invention in detail, an example of the first transparent electrode being a slit pixel electrode and the second transparent electrode being a plate common electrode will be describe in the following.

In at least one embodiment of the invention, the method for fabricating the array substrate comprises:

Step A1, forming a gate electrode and a gate line on a base substrate.

In an example as illustrate in FIG. 5A, the formed gate electrode 1 and gate line 10 is connected to each other.

Step A2, forming a gate insulation layer on the base substrate, the gate insulation layer overlaying the gate electrode and the gate line.

Step A3, forming an active layer on the gate insulation layer.

In an example as illustrated in FIG. 5A, the active layer 2 is located above the gate electrode 1, with it area being smaller than that of the gate electrode 1.

Step A4, forming a source electrode, a drain electrode and a data line on the active layer.

In an example as illustrated in FIG. 5A, the formed source electrode 3 and drain electrode 4 are respectively on one side of the active layer and the source electrode 3 is connected to the data line 20.

Step A5, forming a first insulation layer overlaying the source electrode, the drain electrode and the data line.

Step A6, forming a color filter layer on the first insulation layer.

As an example, a color filter layer is fabricated on the first insulation layer of the array substrate with a known method.

For example, a cross section taken along AA' of FIG. 5A (that is, a region between adjacent pixels) is illustrated in FIG. 4A, wherein the gate insulation layer 200 is formed on the base substrate 100, the data line 20 is formed on the gate insulation layer 200, the first insulation layer 300 is formed on and overlays the data line 20, and the color filter layer 700 is formed on the first insulation layer 300.

Step A7, forming a resin planarization layer on the color filter layer.

In an example as illustrated in FIG. 4A, the resin planarization layer 400 is formed on the color filter layer 700.

Step A8, forming a common electrode layer on the resin planarization layer.

In an example as illustrated in FIG. 4A, a common electrode layer 500 is formed on the resin planarization layer 400.

Step A9, forming a second insulation layer on the common electrode layer.

In an example as illustrated in FIG. 4A, a second insulation layer 600 is formed on the common electrode layer 500.

Step A10, forming a pixel electrode on the second insulation layer and forming an insulation element between adjacent pixel electrodes.

In an example as illustrated in FIG. 4A, a pixel electrode 30 and the insulation element 40 are formed in the same layer, and the insulation element 40 are formed between adjacent pixel electrodes 30.

As illustrated in FIG. 5A, the pixel electrode 30 is connected to the drain electrode 4 by way of a via hole 5.

Figure 7:
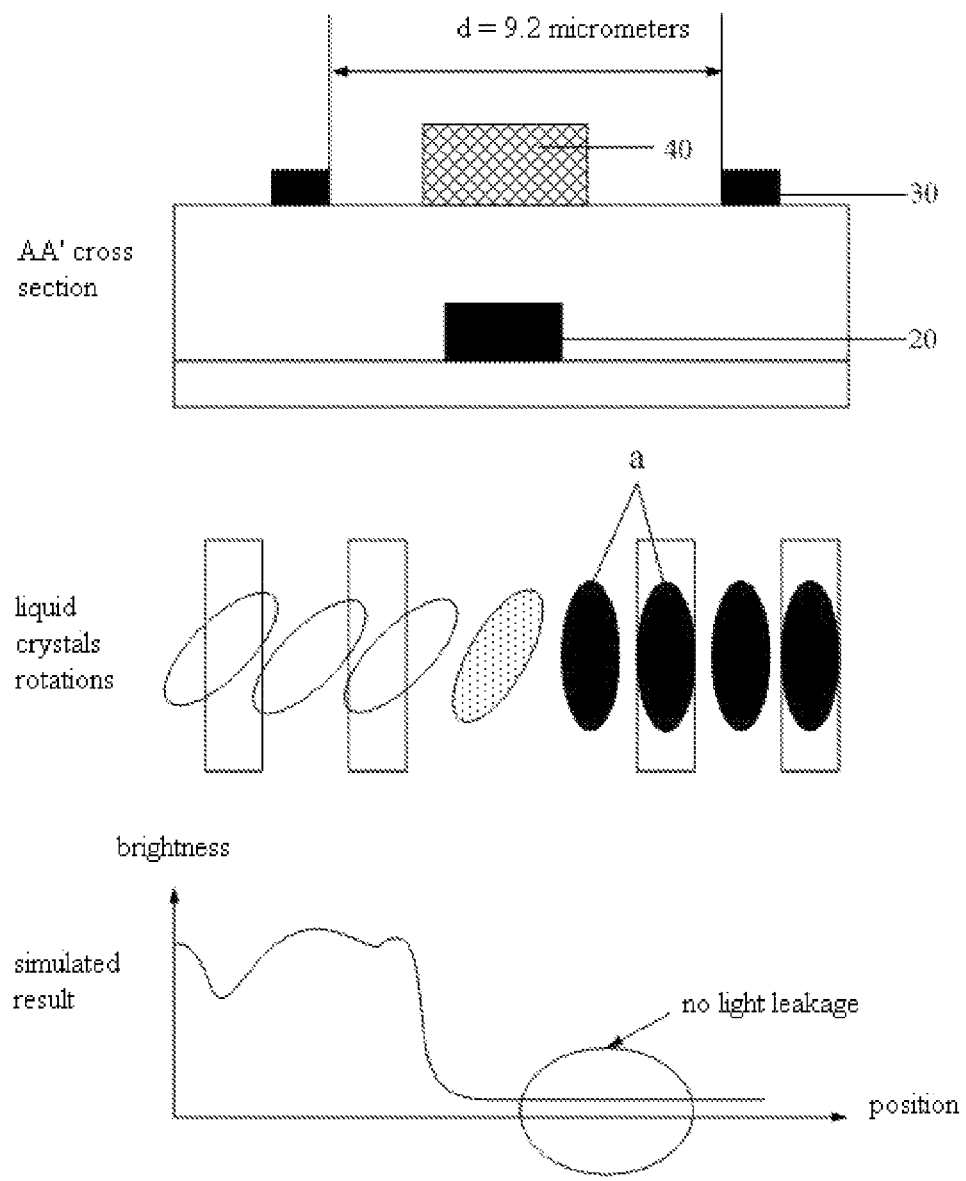
FIG. 7 schematically illustrates a test result of light leakage of an array substrate in accordance with an embodiment of the invention.

With reference to an example of the distance between adjacent pixel electrodes being 9.2 μm (i.e., d=9.2 μm), the light leakage of an array substrate in which the insulation element 40 is disposed between two adjacent pixel electrodes 30, and the insulation element 40 is in the same layer as the pixel electrodes 30 and disposed at locations corresponding to the data line 20 is tested, the test result is shown in FIG. 7. It is seen that a liquid crystal a which should not rotate is not rotated, such that there is not light leakage at a position of the array substrate corresponding to the liquid crystal a. That is, there is no interference between electric fields of two adjacent pixel electrodes of the array substrate of the embodiment of the invention.

This application claims the priority of Chinese Application No. 201410039889.4, filed on Jan. 27, 2014 and which application is incorporated herein by reference.

What is described above is related to the illustrative embodiments of the disclosure only and not limitative to the scope of the disclosure; the scopes of the disclosure are defined by the accompanying claims.

What is claimed is:

1. An array substrate, comprising:
   a base substrate;
   a plurality of gate lines and a plurality of data lines disposed on the base substrate as intersecting with each other to define a plurality of pixel regions;
   a first transparent electrode disposed in each of the pixel regions;
   an insulation element, wherein the insulation element is disposed between two adjacent first transparent electrodes, a top surface of the insulation element is higher than a top surface of the first transparent electrode, and a bottom surface of the insulation element is lower than the top surface of the first transparent electrode, and the insulation element is disposed in a different layer from the first transparent electrode; and an insulation layer, wherein the insulation layer covers the insulation element, and the first transparent electrode is disposed on the insulation layer.

2. The array substrate of claim 1, wherein the first transparent electrode is a slit electrode.

3. The array substrate of claim 2, further comprising a second transparent electrode disposed in each of the pixel regions, wherein the second transparent electrode is a plate electrode or a slit electrode.

4. The array substrate of claim 3, wherein the second transparent electrode is a plate electrode and the second transparent electrode is disposed in a layer different from the first transparent electrode.

5. The array substrate of claim 3, wherein the insulation layer is disposed in each of the pixel regions and
the insulation layer is disposed between the first and second transparent electrodes.

6. The array substrate of claim 3, wherein the second transparent electrode is a slit electrode, the second transparent electrode is disposed in a layer different from the first transparent electrode, and the second transparent electrode and the first transparent electrode are alternately arranged.

7. The array substrate of claim 3, wherein the second transparent electrode is a slit electrode, the second transparent electrode is disposed in a same layer as the first transparent electrode, and the second transparent electrode and the first transparent electrode are alternately arranged.

8. The array substrate of claim 1, wherein the insulation element is disposed at positions corresponding to the gate lines and the data lines.

9. The array substrate of claim 8, wherein the insulation element is of strip-shaped, and a cross section of the insulation element is a rectangle or trapezoid.

10. The array substrate of claim 8, wherein a material of the insulation element is opaque, and the insulation element functions as a black matrix.

11. The array substrate of claim 1, wherein a distance between the top surface of the insulation element and the top surface of the first transparent electrode is larger than or equal to 1 micrometer.

12. The array substrate of claim 1, further comprising a color filter layer disposed below the insulation element.

13. The array substrate of claim 3, wherein the first transparent electrode is a pixel electrode and the second transparent electrode is a common electrode; or the first transparent electrode is a common electrode and the second transparent electrode is a pixel electrode.

14. A display device, comprising the array substrate of claim 1.

15. A method for fabricating an array substrate, comprising:
providing a base substrate which comprises a plurality of pixel regions;
forming a first transparent electrode located in each of the pixel regions of the base substrate;
forming an insulation element between two adjacent first transparent electrodes, wherein a top surface of the insulation element is higher than a top surface of the first transparent electrode, and a bottom surface of the insulation element is lower than the top surface of the first transparent electrode; and
forming an insulation layer covering the insulation element, wherein the first transparent electrode is disposed on the insulation layer,
wherein the insulation element is disposed in a different layer from the first transparent electrode.

16. The method of claim 15, wherein a material of the insulation element is opaque, and the insulation element functions as a black matrix.

17. The method of claim 15, further comprising:
before forming the first transparent electrode: forming a color filter layer below an insulation element to be formed.

18. The method of claim 15, further comprising:
forming a second transparent electrode in each of the pixel regions, wherein the second transparent electrode is a plate electrode or a slit electrode.

19. The method of claim 18,
wherein the insulation layer is formed between the first transparent electrode and the second transparent electrode.

20. The method of claim 15, wherein the first transparent electrode is a slit electrode.

* * * * *